(12) United States Patent
Currin et al.

(10) Patent No.: US 6,330,197 B1
(45) Date of Patent: Dec. 11, 2001

(54) SYSTEM FOR LINEARIZING A PROGRAMMABLE DELAY CIRCUIT

(75) Inventors: Jeffrey D. Currin, Pleasanton, CA (US); Jacob Herbold, Portland, OR (US); Manohari Reddy; Mark Dahl, both of Beaverton, OR (US); Philip T. Kuglin, Tualatin, OR (US)

(73) Assignee: Credence Systems Corporation, Fremont, CA (US)

( * ) Notice: Subject to any disclaimer, the term of this patent is extended or adjusted under 35 U.S.C. 154(b) by 0 days.

(21) Appl. No.: 09/628,702

(22) Filed: Jul. 31, 2000

(51) Int. Cl.[7] ........................................ G11C 7/00
(52) U.S. Cl. .................. 365/194; 365/230.01; 327/158; 327/276
(58) Field of Search ..................... 365/194, 233, 365/230.01; 327/158, 161, 276, 277

(56) References Cited

U.S. PATENT DOCUMENTS

| | | | |
|---|---|---|---|
| 5,963,074 | 10/1999 | Arkin | 327/276 |
| 6,104,223 | * 8/2000 | Chapman et al. | 327/276 |
| 6,151,682 | * 11/2000 | van der Wal et al. | 713/401 |
| 6,166,572 | * 12/2000 | Yamaoka | 327/149 |

* cited by examiner

Primary Examiner—David Nelms
Assistant Examiner—Gene N. Auduong
(74) Attorney, Agent, or Firm—Daniel J. Bedell; Smith-Hill and Bedell (57) ABSTRACT

A random access memory (RAM) having N addressable storage locations is addressed by input data specifying a signal delay, and the RAM reads out control data controlling the delay of a delay circuit. A linearization system automatically adjusts the value of the control data stored at each of the RAM's N addresses so that the delay provided by the delay circuit is a linear function of the value of the input data. The linearization system provides two periodic reference signals ("beat" and "clock") wherein the period $P_B$ of the beat signal and the period $P_C$ of the clock signal are related by the expression $P_B=P_C(N+1)/N$. The linearization system iteratively adjusts the control data stored at each RAM address so that when the RAM continuously reads out the control data stored at the Kth RAM address, the Kth edge of the beat signal and every Nth edge thereafter substantially coincides with an edge of the delay circuit output signal.

21 Claims, 5 Drawing Sheets

SYSTEM FOR LINEARIZING A PROGRAMMABLE DELAY CIRCUIT

BACKGROUND OF THE INVENTION

1. Field of the Invention

The present invention relates in general to programmable delay circuits and in particular to a system for linearizing a programmable delay circuit so that its delay is a linear function of the value of its input control data.

2. Description of Related Art

A typical prior art programmable delay circuit includes a tapped delay line and a multiplexer. The delay line is formed by a set of delay stages connected in series for successively delaying an input signal pulse. Each delay stage may, for example, be a simple logic gate passing its input signal to its output with a delay depending on the switching speed of the logic gate. With the output of each delay stage constituting a separate "tap" of the delay line, the input signal pulse appears at each tap in succession as it traverses the delay line. The delay line taps are connected to separate inputs of the multiplexer for selectively linking one of the delay line taps to the delay circuit's output terminal. An input signal supplied to the delay line therefore passes through one or more delay stages to a selected tap, then passes through the multiplexer to appear as the delay circuit's output signal. The delay between edges of the input and output signal is therefore a function of the control data supplied to the multiplexer.

We normally want the delay provided by a delay circuit to be a linear function of its input control data. If all elements of the delay line had the same unit delay, then the total delay provided by the programmable delay circuit would be a linear function of the number of delay elements the input signal passes through before reaching the selected tap. Therefore the circuit's delay would be a linear function of the value of the control data. However even though delay elements are formed by similar logic gates formed on the same integrated circuit, due to process variations all gates will not have exactly the same switching speed. Such variation in gate switching speed adversely affects the linearity of the delay circuit's delay as a function of the control data supplied to the multiplexer.

U.S. Pat. No. 5,963,074 issued Oct. 5, 1999 to Brian J. Arkin, describes a programmable delay circuit of the type including a tapped delay line for delaying an input signal pulse to produce a set of tap signals selected by a multiplexer. However Arkin's programmable delay circuit also includes a "delay adjustment stage" between the output of the multiplexer and the delay circuit output terminal for finely adjusting the circuit delay. Thus the total delay of the circuit is equal to the sum of the delay through the selected tap, the inherent delay of the multiplexer, and the delay through the delay adjustment stage. A random access memory read addressed by input control data stores at each address "COARSE" control data for controlling the multiplexer and "FINE" control data for controlling the delay of the delay adjustment stage. Thus when the RAM is addressed by input control data, the RAM reads out COARSE and FINE control data in the addressed storage location which sets the delay of the circuit.

Arkin teaches that the total delay of the circuit can be made a linear function of the input control data by appropriately adjusting the values of the COARSE and FINE control data stored at each RAM address. One way to do that is to use an oscilloscope or other device to iteratively measure a timing difference between clock and output signal pulses for each value of input control data and to adjust the COARSE and FINE data values stored at the each RAM address until that each input control data value produces the appropriate delay. However such a labor-intensive process is tedious, time consuming and subject to error.

What is needed is an automatic system for quickly and accurately adjusting the data stored in the RAM so that the circuit delay is a linear function of the input control data addressing the RAM.

SUMMARY OF THE INVENTION

The present invention relates to a system for linearizing the timing of a delay circuit of the type wherein a random access memory (RAM) having N addresses is addressed by input data specifying a desired signal delay, and wherein the RAM reads out control data controlling the delay of a programmable delay circuit. The linearization system automatically adjusts the value of the control data stored at each of the RAM's N addresses so that the delay provided by the delay circuit is a linear function of the value of the input data addressing the RAM.

In accordance with the invention, the linearization system produces two periodic reference signals ("beat" and "clock") of differing, but related, frequencies. In particular, the period $P_B$ of the beat signal and the period $P_C$ of the clock signal are related by the expression:

$$P_B = P_C(N+1)/N.$$

With the clock signal being applied as the input signal to the delay circuit, the linearization system iteratively adjusts the control data stored at the Kth RAM address (for K=0 to N−1) so that when the RAM continuously reads out the control data stored at the Kth RAM address, a Kth edge of the beat signal and every Nth edge thereafter substantially coincides with an edge of the delay circuit output signal. By doing so for each RAM address, the linearization system ensures that the delay provided by the delay circuit is a substantially linear function of the RAM address, and therefore of the value of the input data addressing the RAM.

It is accordingly an object of the invention to provide a system for linearizing a programmable delay circuit so that the delay it provides is a linear function of input delay control data.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

DESCRIPTION OF THE PREFERRED EMBODIMENT(S)

Figure 1:
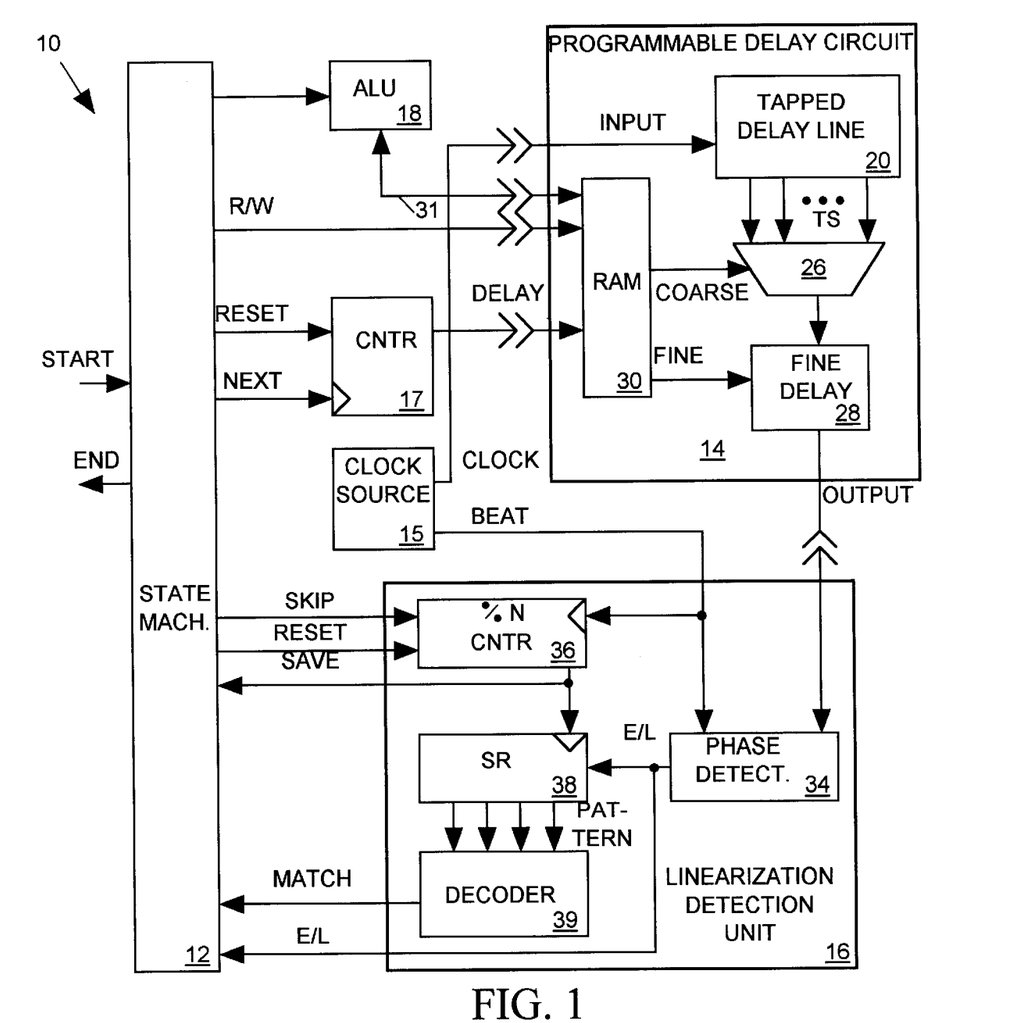
FIG. 1 illustrates in block diagram form a system in accordance with the invention for linearizing a programmable delay circuit.

FIG. 1 illustrates a linearization system 10 for a programmable delay circuit 14 that produces an output signal (OUTPUT) with a delay that is a function of input data DELAY. Linearization system 10, including a state machine 12, a clock source 15, a "linearization unit" 16, a counter 17, and an arithmetic logic unit (ALU) 18, automatically linearizes delay circuit 14 so that the delay between INPUT and OUTPUT signal pulses is a linear function of the value of its input control data DELAY.

Programmable Delay Circuit

Figure 2:
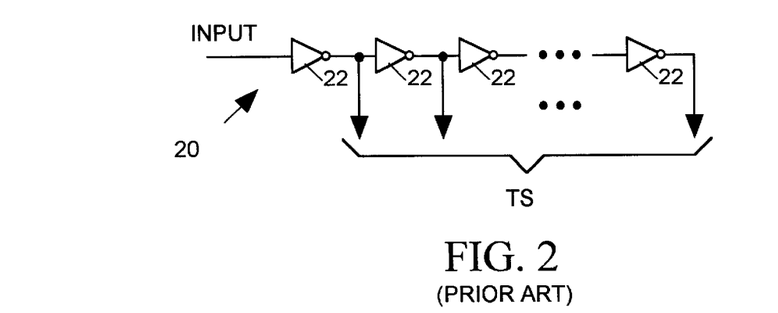
FIG. 2 illustrates a conventional tapped delay line in block diagram form.

Programmable delay circuit 14, described in U.S. Pat. No. 5,963,074 issued Oct. 5, 1999 to Brian J. Arkin (incorporated herein by reference), includes a conventional tapped delay line 20 as illustrated in FIG. 2. Delay line 20 includes a set of logic gates 22 connected in series, each delaying the INPUT signal by a (nominally) similar amount to produce a set of tap signals TS. Tap signals TS provide inputs to a multiplexer 26 (FIG. 1) which forwards one of the tap signals to a programmable "fine delay" circuit 28. Fine delay circuit 28 delays the selected tap signal output of multiplexer 26 by a small adjustable amount to produce the output signal. Thus each output signal pulse is initiated by an INPUT signal pulse but is delayed from the initiating INPUT signal pulse by sum of a "coarse" delay time the INPUT signal pulse requires to travel to a selected tap of ring oscillator 20, a "fine" delay time that the pulse is delayed by fine delay circuit 28, and the inherent delay of multiplexer 26.

Delay circuit 14 includes a random access memory (RAM) 30 having N addressable storage locations, each storing two control data fields COARSE and FINE. When addressed by the input control data DELAY, the addressed COARSE data controls the tap selection made by multiplexer 26 and the addressed FINE data controls the delay of fine delay circuit 28. Since RAM 30 has N storage locations, it can supply any of N different COARSE/FINE data pairs to multiplexer 26 and fine delay circuit 28. Thus each output signal pulse can lag the INPUT signal pulse that initiated it by any of N discrete delays as determined by the values of the COARSE and FINE data stored in the N RAM addresses.

The delay between an INPUT signal pulse and an OUTPUT signal pulse is not a linear function of the COARSE/FINE data input to multiplexer 26 and delay circuit 28. Referring again to FIG. 2, the signal delay between any two neighboring tap signals TS is determined by the switching speed the particular gate 22 between the two taps signals. Although all gates 22 may be of similar design, may be implemented on the same integrated circuit, may be of the same temperature, and may be supplied from the same power source, they will not all have precisely the same delay because process variations will cause them to have slightly different switching speeds. Also since the paths though multiplexer 26 for tap signal TS may have differing inherent delays, the delay through multiplexer 26 can vary depending on tap signal selection. Further, the delay provided by a conventional programmable delay circuit that might be employed as fine delay circuit 28 is typically not a linear function of the value its input FINE control data.

RAM 30 acts as a programmable lookup table to provide an adjustable relationship between the input DELAY data value and the COARSE/FINE control data inputs to multiplexer 26 and programmable delay circuit 28. With the COARSE/FINE control data stored at each addressable storage location within RAM 30 appropriately adjusted, the INPUT-to-output signal delay can be a substantially linear function of the value of the DELAY data input to RAM 30 to the extent permitted by the timing resolution of fine delay circuit 28.

It is possible to use an oscilloscope or other device to measure a timing difference between INPUT and OUTPUT signal pulses for each value of DELAY data input to RAM 30 and then appropriately adjust the data values stored in at each RAM 30 address to provide a linear relationship between the DELAY data value and circuit delay. However such a labor-intensive process is tedious and time consuming. Linearization system 10 of the present invention automatically adjusts the COARSE/FINE data stored in each location of RAM 30 so that the delay of delay circuit 14 is a substantially linear function of the DELAY data input to RAM 30.

Delay Linearization

Linearization system 10 of FIG. 1 includes a clock source 15 producing two periodic reference signals, CLOCK and BEAT, having periods that are related according to the following expression:

$$P_B = P_C(N+1)/N \qquad [1]$$

where $P_B$ is the period of the BEAT signal, $P_C$ is the period of the CLOCK signal, and N is the number of storage locations in RAM 30, and therefore, the number of programmable delay steps of circuit 14. For example, given a 200 MHZ CLOCK signal having a 5 ns period, and N=8, then the BEAT signal will have a frequency of 177.78 MHz and a period of 5.625 ns. Since the two clock signals are related by expression [1] every Nth leading edge of the BEAT signal will coincide with every (N+1)th leading edge of the CLOCK signal.

To linearize the delay of delay circuit 14, clock source 15 is connected to delay circuit 14 so that the CLOCK signal is applied as the INPUT signal to tapped delay line 20. The count output of counter 17 is connected as the DELAY control data input to RAM 30 of delay circuit 14. COUNTER 17 counts pulses of a NEXT signal provided by state machine 12 from 0 (the lowest address of RAM 30) N−1 (the highest address of RAM 30). State machine 12 may reset counter 17 by pulsing a RESET signal.

Linearization detection unit 16 includes a phase detector 34 for comparing phases the OUTPUT and BEAT signals during the linearization process and for producing an "early/late" output bit (E/L) on successive BEAT signal pulse edges indicating whether each BEAT signal pulse edge occurs when the OUTPUT signal is logically high or low. A divide-by-N counter 36 (reset by state machine 12) counts BEAT signal pulses to produce a SAVE signal clocking a serial-in parallel-out shift register 38. Shift register 38 shifts in the current E/L bit output of phase detector 34 on each pulse of the SAVE signal, thereby producing a multiple-bit output data pattern (PATTERN). The SAVE and E/L signals also provide inputs to state machine 12. A decoder 39 decodes the PATTERN data output of shift register 38 to produce a MATCH signal input to state machine 12. With the PATTERN data output of shift register 38 is suitably several bits wide. Decoder 39 asserts the MATCH signal when the PATTERN data exhibits a bit pattern {010 . . . } or {101 . . . } alternating between 1's and 0's.

Figure 3:
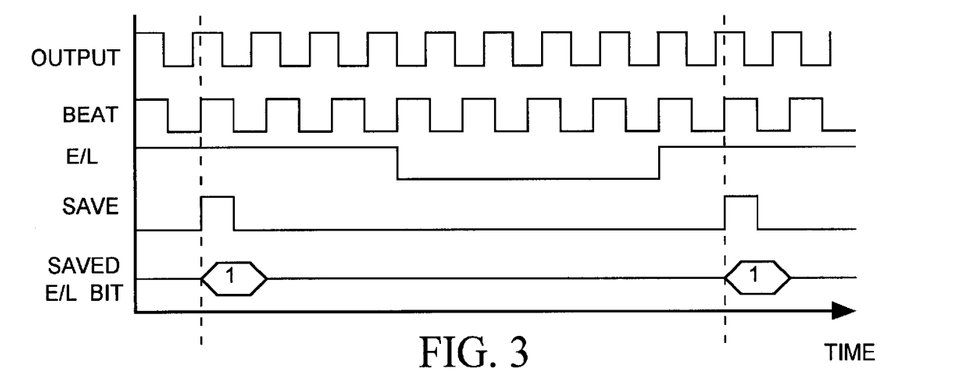
FIGS. 3–7 are timing diagrams illustrating relationships between the signals of the circuit of FIG. 1.

FIG. 3 illustrates the relationship between the BEAT signal and the OUTPUT signal as seen by phase detector 34, assuming N=8. Since the BEAT signal has a lower frequency than the OUTPUT signal, some OUTPUT signal leading edges will arrive earlier at phase detector 34 earlier than the BEAT signal edge, while the BEAT signal is low. Other OUTPUT signal leading edges will arrive later than the BEAT signal edge, i.e. while the BEAT signal is high. A high (logical "1") E/L bit state indicates that the last OUTPUT signal edge was early while a low (logical "0") E/L bit state indicates the last OUTPUT signal edge was late relative to the BEAT signal.

Every Nth BEAT signal pulse edge will have a similar phase relationship to the nearest OUTPUT signal pulse edge. Since divide-by-N counter 36 asserts the SAVE signal on every Nth pulse of the BEAT signal, each successive E/L bit stored in shift register 38 will be of the same state, as illustrated in FIG. 3. Thus after several SAVE signal cycles, the PATTERN data output of shift register 38 would be {111 . . . } or {000 . . . } depending on whether the OUTPUT signal edge is early or late relative to a nearest BEAT signal edge. However as discussed below, the control data is iteratively written into RAM 30 to alter the phase of the OUTPUT signal relative to the BEAT signal during the linearization process, thereby producing other bit patterns in the PATTERN data.

Figure 4:
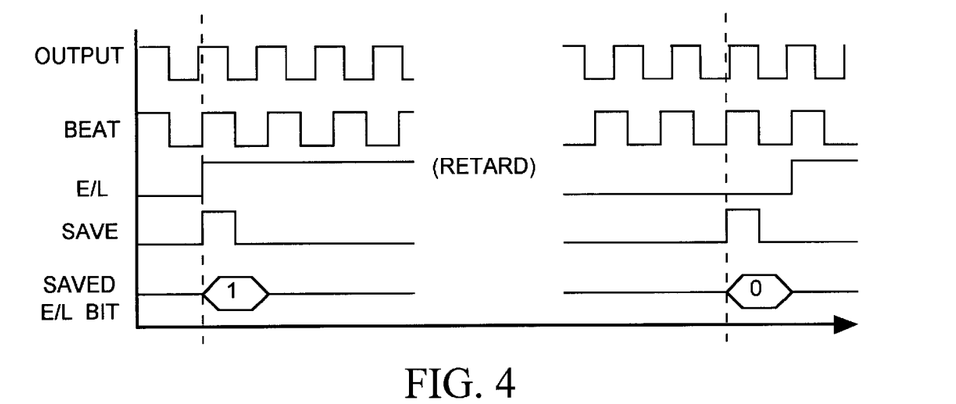

The linearization process begins with an input START signal from an external host computer (not shown) to state machine 12. The output of counter 17 is initially 0 so that it addresses a first storage location in RAM 30 (address 0). RAM 30 thus reads out the COARSE and FINE delay control data stored at address 0. The START signal tells state machine 12 to begin responding to occurrences of the SAVE signal pulse. During the linearization process, the SAVE signal pulse tells state machine 12 to look at the current state of the E/L bit. As illustrated in FIG. 4, when the E/L bit is a 1, indicating the OUTPUT signal leads the BEAT signal, state machine 12 signals ALU 18 to read the COARSE/FINE control data stored in the currently addressed storage location of RAM 30 (FIG. 1) appearing on a bus 31, to increment that data, and to place the incremented COURSE/FINE data back on bus 31. State machine 12 then signals RAM 30 to store the incremented data to RAM address 0. This increases the delay specified by the data stored at RAM address 0 slightly so that when the next SAVE signal pulse occurs, the OUTPUT signal does not lead the BEAT signal by as much. When this process continues for a sufficient number of SAVE signal cycles, the OUTPUT signal pulse will be retarded so much that it will begin to lag the BEAT signal when the SAVE pulse is asserted. Thus the E/L data bit shifted into shift register 38 will now be a 0 as illustrated in FIG. 4.

Figure 5:
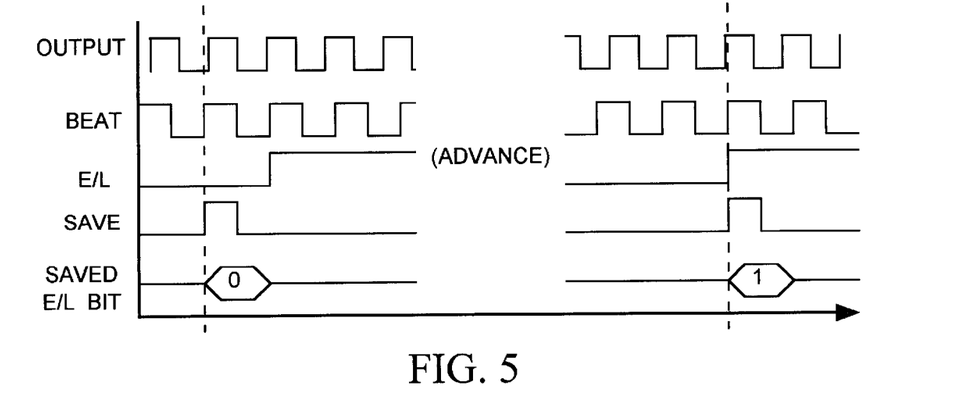

Referring to FIG. 5, whenever state machine 12 detects that the E/L bit is a 0 following a SAVE signal pulse, indicating the OUTPUT signal lags the BEAT signal, state machine 12 signals ALU 18 to decrement the COARSE/FINE control data value stored in the current RAM 30 address, thereby slightly reducing the delay of delay circuit 14 and slightly advancing the next OUTPUT signal pulse controlled by the COARSE/FINE data stored at that address. Since the OUTPUT signal pulse had only slightly lagged the corresponding BEAT signal pulse it will now lead the BEAT signal on the next SAVE signal pulse. Hence the next E/L bit saved in shift register 38 will be a 1.

Thus after a sufficient number of SAVE signal cycles, linearization system 10 will have fallen into a pattern of alternately incrementing and decrementing the data stored at the current RAM 30 address. At this point the PATTERN data output of shift register 38 will exhibit an alternating pattern of 1's and 0's {101 . . . } or {010 . . . } indicating that every (N+1)th OUTPUT signal leading edge is substantially phase locked to the leading edge of every Nth pulse of the BEAT signal. Decoder 39 will then assert the MATCH signal input to state machine 12.

Figure 6:
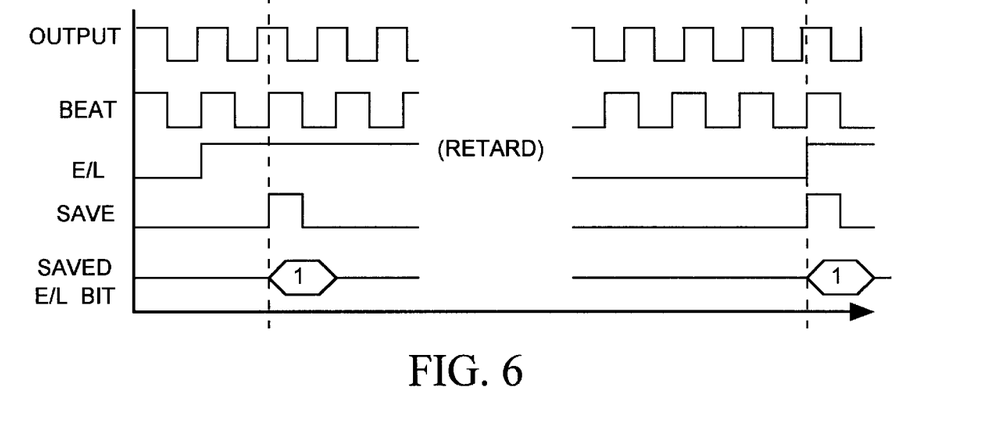
Figure 7:
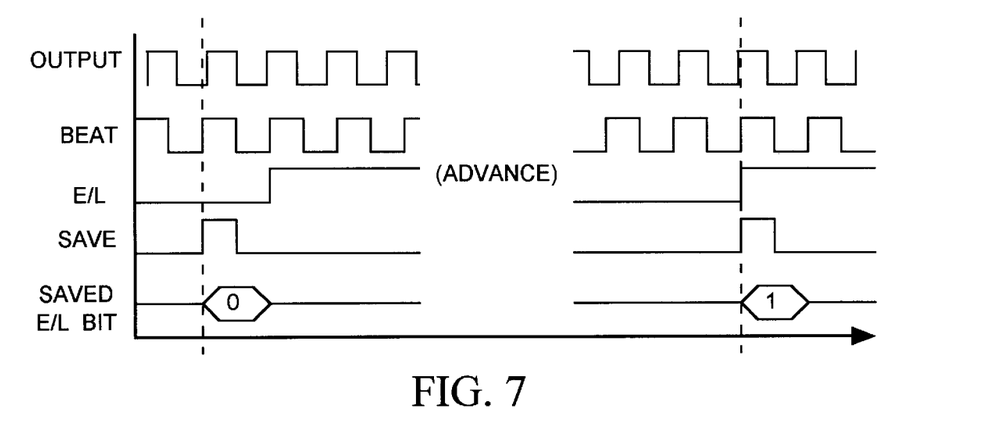

State machine 12 responds to the MATCH signal by pulsing a NEXT signal to increment counter 17 and by pulsing a SKIP signal telling counter 36 it to skip (not count) the next OUTPUT signal pulse. Thus the SAVE signal is retarded by one OUTPUT signal cycle as illustrated in FIG. 6, and phase detector 34 now begins comparing the OUTPUT signal pulse produced with a delay specified by address 1 of RAM 30 to a corresponding BEAT signal pulse. Depending on the COARSE/FINE data values currently stored at the RAM 30 address, the OUTPUT signal may again lead (or lag) the BEAT signal on the next pulse of the SAVE signal, as illustrated in FIG. 6. State machine 12 then begins incrementing or decrementing the COARSE/FINE data in that next RAM 30 address following each SAVE signal pulse until, as illustrated in FIGS. 6 and 7, every (N+1)th OUTPUT signal edge is again brought substantially into phase with a BEAT signal edge and the shift register 38 output PATTERN data again exhibits the alternating bit pattern. Decoder 39 then again asserts the MATCH signal input to state machine 12 and state machine 12 again signals counter 36 skip the next output pulse in its count and pulses the NEXT signal to increment counter 17. This process is repeated until linearization system 10 has adjusted the COARSE/FINE data stored in all N addresses of RAM 30. At that point state machine 12 sends an END signal to the external host computer to indicate that the linearization process is complete.

The relationship between the DELAY data input to RAM 30 and the INPUT-to-OUTPUT signal pulse delay through delay circuit 14 is now linear so that a unit increase in the DELAY data value addressing RAM 30 will increase the pulse delay by 1/Nth of the period $_c$ of the CLOCK signal. Linearization system 10 may now be disconnected from programmable delay circuit 14 so that it can be used to adjustably delay an externally generated INPUT signal to produce the OUTPUT signal with a delay determined by DELAY data input from an external source.

Self-linearizing Timing Signal Generator

Figure 8:
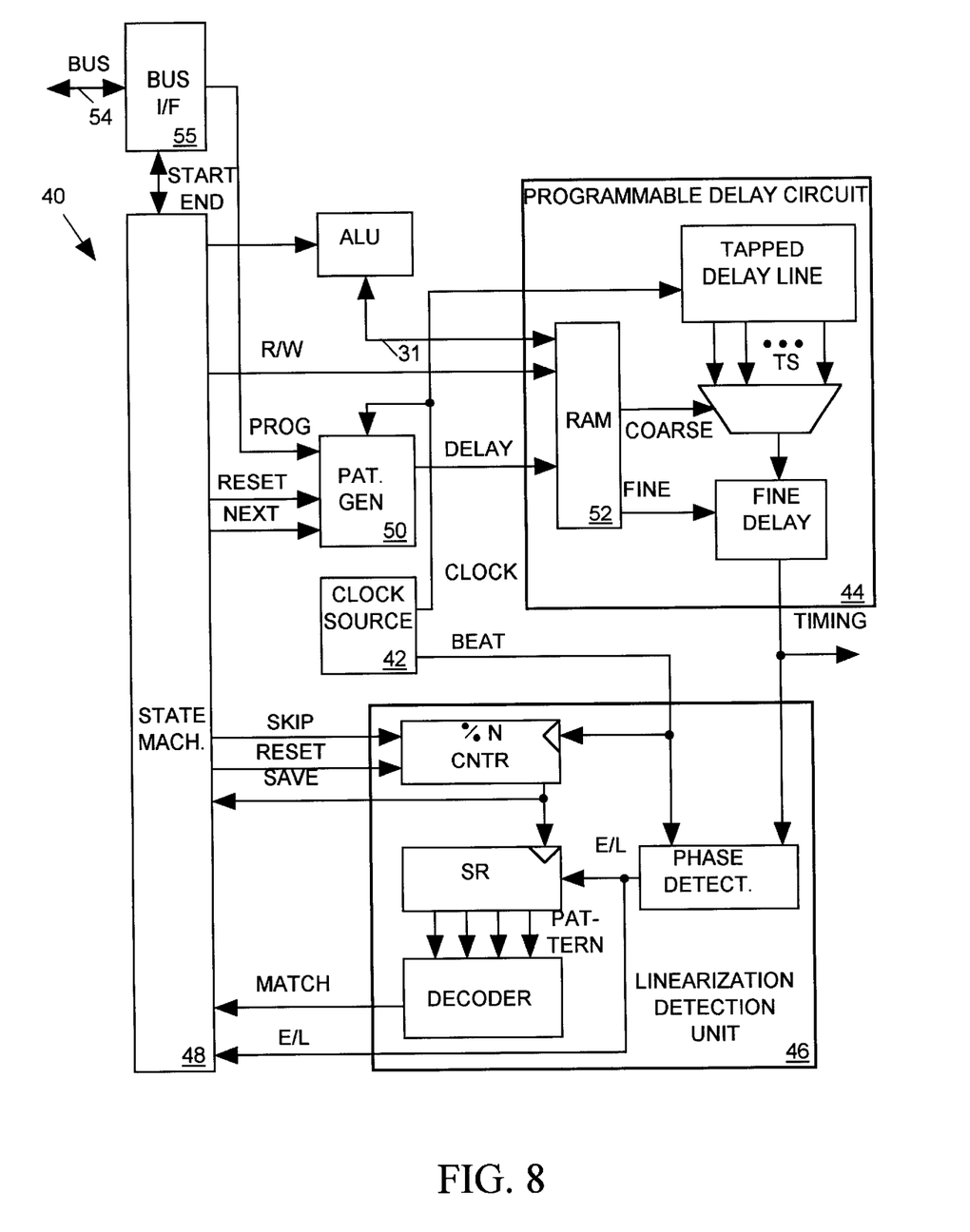
FIGS. 8 illustrates in block diagram form self-linearizing timing signal generator in accordance with an alternative embodiment of the invention.

FIG. 8 illustrates in block diagram form a self-linearizing timing signal generator 40 for producing an output timing signal (TIMING) having an adjustable phase and frequency relative to the output of a clock source 42 similar to clock source 15 of FIG. 2. Timing signal generator 40 includes a programmable delay circuit 44 and a linearization detection unit 46 similar to delay circuit 14 and linearization detection unit 16 of FIG. 1. However as seen in FIG. 8, counter 17 of linearization system 10 (FIG. 1) has been replaced with a conventional algorithmic pattern generator 50 that may be programmed by an external host computer via programming data (PROG) transmitted over a conventional bus 54 and bus interface circuit 55. Bus interface circuit 55 also receives a START command from a host computer via bus 54 and forwards a START signal to state machine 48, and receives the END signal from state machine 48 and forwards an END message to the host computer via bus 54

To control the frequency and phase of the TIMING signal, an external host computer (not shown) programs pattern generator 50 via a bus 54 and a bus interface circuit 55 to supply a desired DELAY control data sequence to the RAM 52 of delay circuit 44. Before initiating the linearization process with the START signal, the host computer programs pattern generator 50 to behave like counter 17 of FIG. 1. State machine 48 will linearize delay circuit 44 in the same way that state machine 12 of FIG. 1 linearizes delay circuit 14.

Multiple Parallel Self-Calibrating Timing Signal Generators

Figure 9:
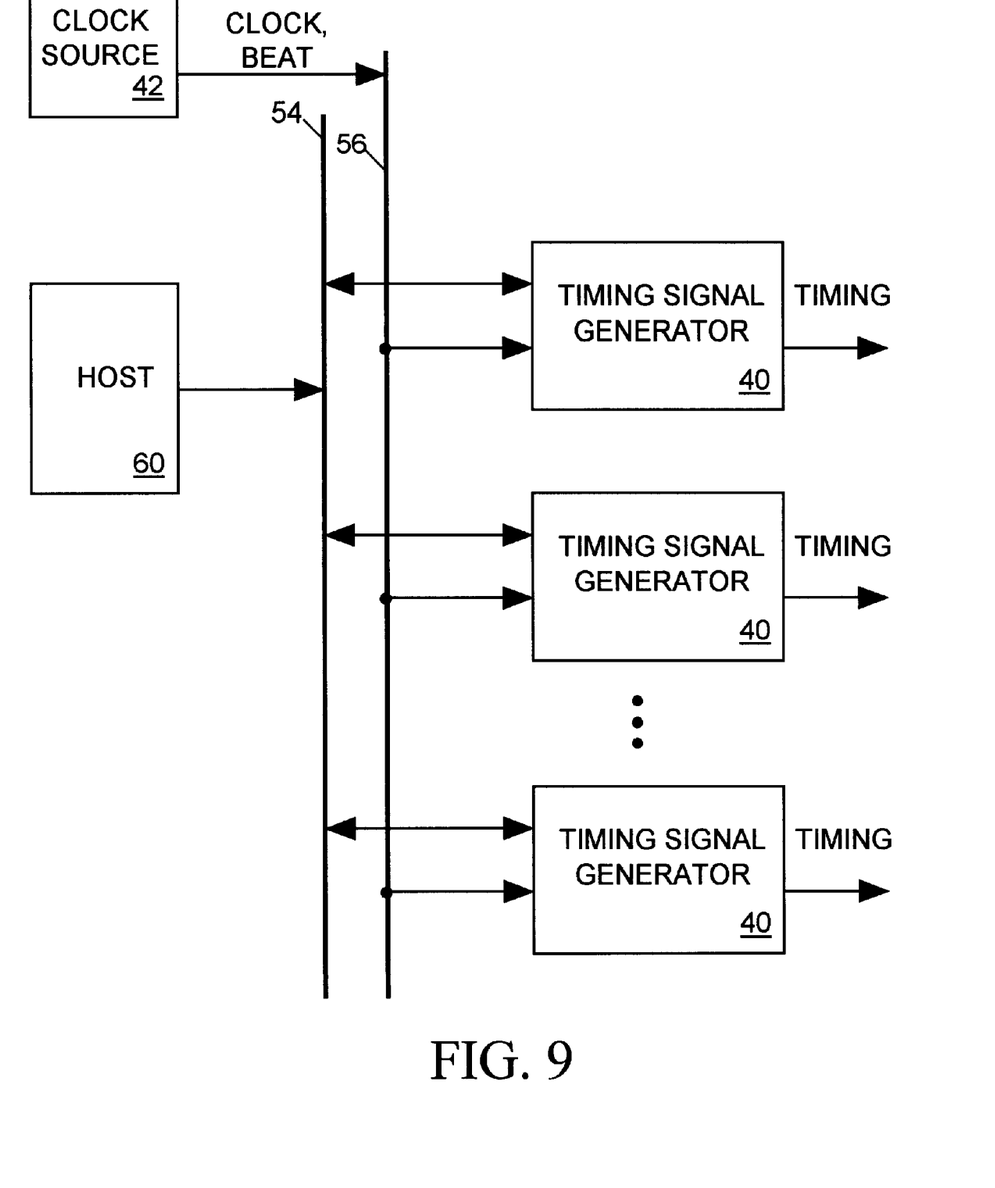
FIG. 9 illustrates in block diagram form a self-linearizing timing signal generation system in accordance with the invention employing a set of timing signal generators similar to that of FIG. 8

A typical integrated circuit tester employs many timing signal generators to produce several timing signal that are shifted in phase from one another that may be used as references for timing test events. As illustrated in FIG. 9 several copies of timing signal generator 40 of FIG. 8 can be linked to a common clock source 42 via CLOCK and BEAT lines 56 and to host computer 60 via bus 54. Host computer 60 uses bus 54 to supply programming data to the pattern generator within each timing signal generator 40, each of which occupies a separate portion of the address space of bus 54.

To start the linearization process, host computer 60 uses bus 54 to appropriately program the pattern generator in each timing signal generators 40 via bus 51 and then sends a START command to each timing signal generator 40 via bus 54. Each timing signal generator 40 then linearizes itself in the manner described above and thereafter sends an END message to host computer 60 indicating when the linearization process is complete. Each END message suitably identifies the timing signal generator 40 that sent it so that the host computer can determine when all timing signal generators 40 have completed the linearization process.

Note that providing the self-linearization capability for timing signal generators 40 requires only one additional control line (BEAT) beyond the CLOCK signal line and bus 51 lines otherwise needed to program and operate each timing signal generator 40. Note also that while the distributed BEAT and CLOCK signals must be of a particular frequency relationship, they may be of arbitrary phase relationship. Finally, note that the system is easily scalable since an additional timing signal generator 40 can be added to the system simply by connecting it to existing buses 54 and 56.

Thus has been shown an described a system for linearizing a programmable delay circuit. While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. For a delay circuit for producing an output signal in response to an input signal with a delay controlled by control data read out of a random access memory (RAM) having a plurality of addressable storage locations, each storing data at a separate RAM address and each reading out its stored control data when addressed, a method for adjusting the control data stored in said plurality of addressable storage locations so that said delay is a linear function of the RAM address, the method comprising the steps of:

a. generating a clock signal having edges occurring with a period $P_C$ and a beat signal having edges occurring with a period $P_B$, wherein $P_C$ and $P_B$ differ;

b. applying the clock signal as the input signal to the delay circuit such that said delay circuit produces said output signal in response to said clock signal; and c. for each of said addressable storage locations:
      c1. addressing the addressable storage location,
      c2. performing a phase comparison of an edge of said beat signal to an edge of said output signal, and
      c3. adjusting the control data stored in said addressable storage location in accordance with a result of said phase comparison.

2. The method in accordance with claim 1 wherein step c3 comprises the substeps of:

c3a. adjusting the control data stored in said addressable storage location to increase the delay of said delay circuit when said phase comparison indicates the edge of said beat signal lags the edge of said output signal, and c3b. adjusting the control data stored in said addressable storage location to decrease the delay of said delay circuit when said phase comparison indicates the edge of said beat signal leads the edge of said output signal.

3. The method in accordance with claim 1 wherein $P_B=P_C(N+1)/N$, where N is a number of said addressable storage locations of said RAM.

4. The method in accordance with claim 3 wherein step c3 comprises the step of adjusting the control data stored in said storage location so that every Nth edge of the beat signal substantially coincides with every (N+1)th edge of said output signal.

5. An apparatus for generating a timing signal, the apparatus comprising:

a random access memory having a plurality of addressable storage locations, each reading out its stored control data when addressed;

first means for generating a clock signal having edges occurring with a period $P_C$ and for generating a beat signal having edges occurring with a period $P_B$, wherein $P_C$ and $P_B$ differ;

a delay circuit for delaying the clock signal to produce the timing signal with a delay controlled the control data read out of said RAM; and second means for iteratively addressing and adjusting the control data stored in each of said addressable storage locations such that when any one of said storage locations is addressed and reads out control data controlling said delay, edges of the beat signal thereafter substantially coincide with edges of the output signal.

6. The apparatus in accordance with claim 5 wherein said second means comprises:

third means for addressing each of said addressable storage locations, fourth means for performing phase comparisons of edges of said beat signal to edges of said output signal while said second means is addressing each of said addressable storage locations, and fifth means for adjusting the control data stored in each of said addressable storage locations in accordance with a result of said phase comparisons.

7. The apparatus in accordance with claim 6 wherein said fifth means adjusts the control data stored in one of said addressable storage locations to increase the delay of said delay circuit when one of said phase comparisons indicates the edge of said beat signal lags the edge of said output signal, and wherein said fifth means adjusts the control data stored in one of said addressable storage locations to decrease the delay of said delay circuit when one of said phase comparisons indicates the edge of said beat signal leads the edge of said output signal.

8. The apparatus in accordance with claim 5 wherein $P_B=_C(N+1)/N$, where N is a number of said addressable storage locations of said RAM.

9. The apparatus in accordance with claim 8 wherein said second means adjusts the control data stored in the addressed storage location so that every Nth edge of the beat signal substantially coincides with an edge of said output signal.

10. The apparatus in accordance with claim 9 wherein said second means comprises:

third means for addressing said addressable storage locations;

fourth means for comparing a phase of every Nth edge of the beat signal to an edge of the output signal and producing a sequence of bits, each bit indicating whether an edge of the output signal leads an edge of the beat signal; and fifth means for adjusting the control data stored in one of said addressable storage locations in response to said sequence of bits.

11. The apparatus in accordance with claim 10 wherein wherein said fifth means adjusts the control data stored in said one of said addressable storage locations to increase the delay of said delay circuit when said sequence of bits indicates the edge of said beat signal lags the edge of said output signal, and wherein said fifth means adjusts the control data stored in said one of said addressable storage locations to decrease the delay of said delay circuit when said sequence of bits indicates the edge of said beat signal leads the edge of said output signal.

12. An apparatus for generating a plurality of timing signals comprising:

first means for generating a clock signal having edges occurring with a period $P_C$ and a beat signal having edges occurring with a period $P_B$, wherein $P_B$ and $P_C$ differ; and a plurality of timing signal generators, each receiving the clock and the beat signal, and each comprising:

a random access memory having a plurality of addressable storage locations, each reading out its stored control data when addressed;

a delay circuit for delaying the clock signal to produce the timing signal with a delay controlled the control data read out of said RAM; and second means for iteratively addressing and adjusting the control data stored in each of said addressable storage locations such that when any one of said storage locations is addressed and reads out control data controlling said delay, edges of the beat signal thereafter substantially coincide with edges of the output signal.

13. The apparatus in accordance with claim 12 wherein said second means comprises:

third means for addressing each of said addressable storage locations, fourth means for performing phase comparisons of edges of said beat signal to edges of said output signal while said second means is addressing each of said addressable storage locations, and fifth means for adjusting the control data stored in each of said addressable storage locations in accordance with a result of said phase comparisons.

14. The apparatus in accordance with claim 13 wherein said fifth means adjusts the control data stored in one of said addressable storage locations to increase the delay of said delay circuit when one of said phase comparisons indicates the edge of said beat signal lags the edge of said output signal, and wherein said fifth means adjusts the control data stored in one of said addressable storage locations to decrease the delay of said delay circuit when one of said phase comparisons indicates the edge of said beat signal leads the edge of said output signal.

15. The apparatus in accordance with claim 12 wherein $P_B = _C(N+1)/N$, where N is a number of said addressable storage locations of said RAM.

16. The apparatus in accordance with claim 15 wherein said second means adjusts the control data stored in the addressed storage location so that every Nth edge of the beat signal substantially coincides with an edge of said output signal.

17. The apparatus in accordance with claim 12 wherein said second means comprises:

third means for addressing said addressable storage locations;

fourth means for comparing a phase of every Nth edge of the beat signal to an edge of the output signal and producing a sequence of bits, each bit indicating whether an edge of the output signal leads an edge of the beat signal; and fifth means for adjusting the control data stored in one of said addressable storage locations in response to said sequence of bits.

18. The apparatus in accordance with claim 17 wherein wherein said fifth means adjusts the control data stored in said one of said addressable storage locations to increase the delay of said delay circuit when said sequence of bits indicates the edge of said beat signal lags the edge of said output signal, and wherein said fifth means adjusts the control data stored in said one of said addressable storage locations to decrease the delay of said delay circuit when said sequence of bits indicates the edge of said beat signal leads the edge of said output signal.

19. An apparatus for generating an output signal in response to an input signal with a delay controlled by input data, the apparatus comprising:

a delay circuit for delaying an input signal to produce said output signal with a delay controlled by control data supplied to said delay circuit, a plurality of addressable storage locations addressed by said input data for storing control data, each reading out its stored control data to said delay circuit for controlling said delay when addressed by said input data, a linearization system for automatically adjusting the value of the control data stored in each of said plurality of addressable storage locations so that the delay provided by the delay circuit is a linear function of a value of the input data, the linearization system comprising:

means for generating a beat signal having edges occurring with a period $P_B$ and a clock signal having edges occurring with a period $P_C$, where $P_C$ and $P_B$ differ, and means for applying the clock signal as said input signal to said delay circuit.

20. The apparatus in accordance with claim 19 further comprising:

means for performing phase comparisons of edges of said beat signal to edges of said output signal;

means for adjusting the control data stored in said plurality of addressable storage locations in response to said phase comparisons.

21. The apparatus in accordance with claim 19 wherein $P_B = P_C(N+1)/N$, where N is a number of said addressable storage locations.

* * * * *